United States Patent [19]

Ueno et al.

[11] 4,309,668
[45] Jan. 5, 1982

[54] STRIPE-GEOMETRY DOUBLE HETEROJUNCTION LASER DEVICE

[75] Inventors: Masayasu Ueno; Hiroo Yonezu; Roy Lang, all of Tokyo, Japan

[73] Assignee: Nippon Electric Co., Ltd., Tokyo, Japan

[21] Appl. No.: 14,012

[22] Filed: Feb. 21, 1979

[30] Foreign Application Priority Data

Feb. 20, 1978 [JP] Japan .................. 53-18882
Mar. 7, 1978 [JP] Japan .................. 53-26355
Mar. 7, 1978 [JP] Japan .................. 53-26356

[51] Int. Cl.$^3$ ............................................. H01S 3/19
[52] U.S. Cl. ............................................. 331/94.5 H
[58] Field of Search ............... 331/94.5 H; 357/17, 357/18

[56] References Cited

U.S. PATENT DOCUMENTS 3,363,195 1/1968 Furnanage et al. ............ 331/94.5 H
4,105,955 8/1978 Hayashi et al. ................ 331/94.5 H

OTHER PUBLICATIONS

Casey et al., *Heterostructure Lasers Part B*, published by Academic Press Inc., N. Y., 1978, pp. 207-216 and 307.

*Primary Examiner*—James W. Davie
*Attorney, Agent, or Firm*—Sughrue, Mion, Zinn, Macpeak and Seas

[57] ABSTRACT

A stripe-shaped excitation region is provided in an active layer of a double heterojunction laser device, the excitation region and the other region of the active layer being endowed with an effective refractive index difference or optical absorption coefficient difference therebetween, and a carrier injection region is provided contiguously to the excitation region, whereby the laser device exhibits a low ohmic resistance, effects a stable lower-order transverse mode oscillation and suppresses relaxation oscillations. By preventing the stripe-shaped excitation region and the carrier injection region from being exposed to reflective surfaces, the aforecited beneficial results can be realized over a wide range of operating currents, and a laser device of extremely high power density emission is achieved due to the increase of the threshold of the catastrophic optical damage on mirrors.

18 Claims, 21 Drawing Figures

STRIPE-GEOMETRY DOUBLE HETEROJUNCTION LASER DEVICE

BACKGROUND OF THE INVENTION

This invention relates to a semiconductor laser device, and more particularly to a stripe-geometry double heterojunction laser device.

A multiple heterostructure semiconductor laser made of a semiconductor crystal such as (Al.Ga)As has a low threshold current value. To take a GaAs-GaAlAs double heterojunction laser as an example, it is capable of a highly efficient oscillation even at room temperature, and thus it has been used in optical fiber communication. In order to operate lasers of this type at the smallest possible current value and to oscillate them in a single transverse mode or in a state close thereto, various stripe geometry laser devices have been proposed and manufactured for experimental purposes. As the main stripe structures, there have been reported a proton bombardment type stripe semiconductor laser, a mesa type stripe semiconductor laser, a planar type stripe semiconductor laser, an electrode type stripe semiconductor laser, etc. In these stripe semiconductor lasers, higher-order transverse modes are prone to oscillate at a stripe width of 20 odd $\mu$m or above, and hence, the stripe width is usually set at 10 $\mu$m to 20 $\mu$m or so.

In all the cases, however, there are common disadvantages as described below. In the lateral direction of a light emitting region (the direction being parallel to a p-n junction and perpendicular to the optic axis of output light), an optical amplification gain distribution owing to injection carriers has a gentle optical guiding, and only this optical guiding acts to confine laser light. Moreover, in the case of a stripe width of approximately 10 odd $\mu$m at which the oscillation of lower-order transverse modes is possible, a bell-shaped carrier density profile is liable to be formed by the injection and has a negative optical guiding, and the carrier density profile at the center of the stripe is reduced by an intense induced emission of the laser beam, so that the optical amplification and guiding is weakened. Therefore, the transverse modes become unstable and easy to move rightwards and leftwards, with the result that the oscillation occurs in a heavy loss state and that a non-linear part (kink) appears in the current-optical output characteristic frequently with reproducibility. In consequence, the near-field pattern and the far-field pattern vary, and serious drawbacks such as lowering of the coupling efficiency with an optical fiber or the like external optical system, degradation of modulation characteristics and increase of noise are encountered.

As an expedient for eliminating the nonlinearity, it has been reported to make the stripe as narrow as several $\mu$m or so and to effect an oscillation in the shape of a filament. With this expedient, however, the kink is not perfectly removed, but merely the output level of the kink is raised. Besides, this measure of narrowing the stripe is undesirable for semiconductor laser characteristics in that the threshold current density rises abruptly, that the external differentiation quantum efficiency lowers and that the laser beam intensity which can be produced without causing any optical damage in a reflection surface lowers.

In order to eliminate the disadvantages of the prior art stripe geometry semiconductor lasers set forth above, it is necessary to stabilize the optical guiding in the horizontal direction without making the stripe width very small. On the other hand, in an optical communication system in which semiconductor lasers are principally used, a semiconductor laser for a light source needs to have its dynamic characteristics stabilized. A semiconductor laser device in which relaxation oscillations which appear in the dynamic characteristics are suppressed and which exhibits a stable rectangular response waveform to a rectangular driving current waveform is required as the light source for optical communication.

SUMMARY OF THE INVENTION

Therefore, an object of this invention is to provide a stripe-geometry heterojunction laser device which is capable of stable lower-order transverse mode oscillation and which has excellent operating characteristics with relaxation oscillations suppressed.

Another object of this invention is to provide a stripe-geometry double heterojunction laser device which is capable of stable single transverse mode oscillation over a wide range of operating currents and which has excellent dynamic characteristics with relaxation oscillations suppressed.

According to this invention, there is provided a stripe-geometry semiconductor laser device wherein a stripe-shaped active region which has an effective complex refractive index difference with respect to outer regions is disposed within an active layer and wherein a carrier injection region which includes the stripe-shaped active region and which extends on both sides thereof to approximately a carrier diffusion length is disposed.

Further, according to this invention, there is provided a stripe-geometry double heterojunction laser device characterized in that within an active layer, a stripe-shaped active region having a band gap which is smaller than that of the active layer and with which an effective refractive index relative to the active layer becomes greater than $|10^{-4}|$ is disposed, that a carrier injection region is disposed adjacent to both sides of the stripe-shaped active region, and that the stripe-shaped active region and the carrier injection region does not lie in contact with reflective surfaces.

BRIEF DESCRIPTION OF THE DRAWINGS

Hereunder, embodiments of this invention will be described with reference to the drawings wherein:

FIG. 2C is a plan view of the embodiment of FIG. 2A;

FIG. 3 is a plan view of a semiconductor laser device which is a third embodiment of this invention and in which a stripe-shaped active region is formed to be longer than a carrier injection region;

FIG. 4 is a sectional view of a semiconductor laser device which is a fourth embodiment of this invention and in which a carrier injection region is formed by diffusing an impurity of a conductivity type opposite to that in the case of the second embodiment into outer parts thereof, while

FIG. 10 is a sectional view of a semiconductor laser device which is a ninth embodiment of this invention and in which a carrier injection region is formed by etching off outer parts thereof, while FIGS. 12 to 19 show embodiments wherein this invention is applied to a case of forming four layers on a substrate; among which

DESCRIPTION OF THE PREFERRED EMBODIMENTS

Figure 1:
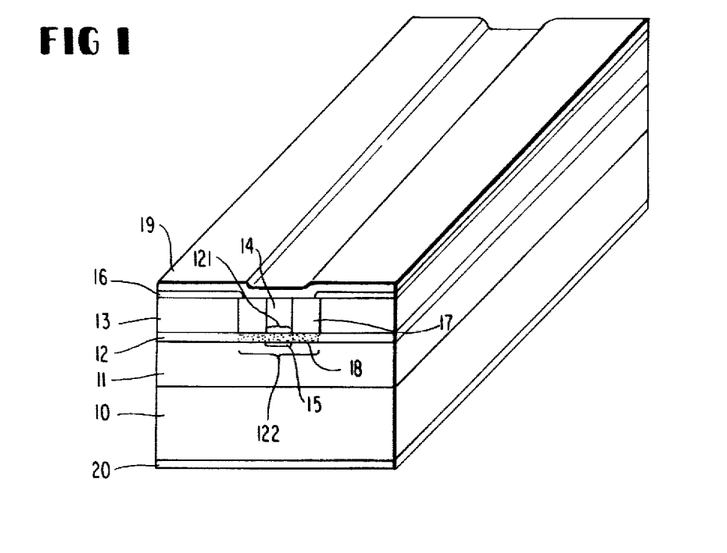
FIG. 1 is a perspective view of a semiconductor laser device which is a first embodiment of this invention and in which a carrier injection region is formed by impurity diffusion.

A first embodiment is shown in FIG. 1. As is now well known in the art, a double heterostructure portion is formed on a GaAs substrate on which are grown to following epitaxial layers in the order recited: $AnAl_xGa_{1-x}As$ layer, $x>0$; an $Al_yGa_{1-y}As$ layer, $0 \leq y < x$; and an $Al_zGa_{1-z}As$ layer, $z>y$.

As a typical example, an n-type $Al_{0.3}Ga_{0.7}As$ layer 11 which is about 3 μm thick, an n-type GaAs active layer 12 (carrier concentration 167 $3 \times 10^{18}$ cm$^{-3}$, Te-doped) which is about 0.2 μm thick, and an n-type $Al_{0.3}Ga_{0.7}As$ layer 13 which is about 2 μm thick are formed on an n-type GaAs substrate 10 by the epitaxial liquid growth. After forming a silicon dioxide ($SiO_2$) film on the $Al_{0.3}Ga_{0.7}As$ layer 13, zinc (Zn) is diffused through a window of a width of 5 μm provided by the photoresist technique to form Zn-diffused region 14.

As the methods of diffusing Zn, there are the drive-in diffusion process, the two-zone process, etc. A Zn-diffusion front 15 is controlled so as to lie in contact with the interface between the active layer 12 and the n-type $Al_{0.3}Ga_{0.7}As$ layer 11 or so as to be somewhat deeper. Accordingly, that region 121 in the active layer 12 in which Zn is diffused (stripe-shaped active region) is turned into a p-type region which has a carrier concentration of $3-8 \times 10^{18}$ cm$^{-3}$ and which exhibits the p-type owing to the so-called impurity compensation. Thus, a refractive index difference on the order of $10^{-3}$ develops between the Zn-diffused region 121 and the other part of the active layer 12. Subsequently, the $SiO_2$ film is removed, $SiO_2$ film 16 is formed on the $Al_{0.3}Ga_{0.7}As$ layer 13, an opening having a width of 14 μm around the Zn-diffused stripe is provided in the $SiO_2$ film 16 by the photoresist technique, and Zn is diffused to form Zn-diffused region 17. A diffusion front 18 of this Zn diffusion is controlled so as to lie in contact with the interface between the n-type $Al_{0.3}Ga_{0.7}As$ layer 13 and the active layer 12 so as to be somewhat shallower. In this Zn diffusion, Zn is diffused at 600° C. by the closed tube process employing a metal zinc source, and its concentration is made $2-3 \times 10^{19}$ cm$^{-3}$ or higher. Thereafter, a p-type ohmic contact 19 and an n-type ohmic contact 20 are formed. Then, a semiconductor laser device is obtained (FIG. 1).

When a forward current is caused to flow in the device of FIG. 1, that part of the active layer 12 which underlies the Zn-diffused region 17 becomes a carrier injection region 122, and that part of the Zn-diffused region 14 which lies within the active layer 12 becomes the stripe-shaped active region 121 which carries out an optical guiding action.

The principle of this invention is that a wide uniform-gain region is provided within an active layer, while an effective complex refractive index difference fixed to a crystal is established in the region, thereby realizing a stable optical guiding and simultaneously suppressing relaxation oscillations in dynamic characteristics. More specifically, as clearly stated in the specification of U.S. Pat. No. 4,105,955 assigned to the same assignee as in the present application, when the variation of an effective band gap and the increase or decrease of a refractive index which are caused by impurity doping are exploited, a spacial distribution of refractive indices fixed to a crystal can be formed in the transverse direction of a stripe within an active layer, whereby a stable optical guiding can be achieved.

In particular, when an impurity is diffused into the shape of a stripe in a multiple heterojunction wafer at a low concentration and the diffusion front is caused to reach the active layer to establish an effective refractive index difference between the impurity-diffused portion and the outer portions thereof, the lower-order transverse mode oscillation can be stably attained. It has been revealed by the inventors that, by way of example, when the stripe width is made 5 μm, the fundamental transverse mode oscillation is effected inasmuch as the effective refractive index difference ratio (a value obtained by dividing the difference of the refractive indices of the impurity-diffused portion and the outer portions thereof by the refractive index of the impurity-diffused portion) is not greater than $1.0 \times 10^{-3}$ or not less than $-1.0 \times 10^{-2}$. In this manner, the refractive index difference need not always be positive (the impurity region has a refractive index higher than that of the outer region thereof), but a stable laser oscillation is realized even when it is negative. However, the positive index difference is more favourable. In the case of a negative index difference, the laser oscillation of leaky modes is carried out. It has also been revealed by the inventors that the increase of the threshold current value and the lowering of the external differentiation quantum efficiency which are ascribable to such an operation are minimal at the stripe width of approximately 5 μm.

As methods for the low concentration diffusion, there are, for example, the drive-in diffusion process and the application diffusion process.

Further researches by the inventors have revealed that the refractive index difference need not always be established for the stabilization of the optical guiding as to the transverse direction in the active layer, but that the optical guiding can be stabilized by making the optical absorption coefficient of the stripe region within the active layer in the state in which no carrier is injected (in the non-excited state) effectively lower than that of the outer region by several tens to several hundreds cm$^{-1}$. More specifically, the optical guiding can be stabilized by establishing an absorption coefficient difference fixed to the crystal by the use of e.g. a method wherein at the fabrication of the multiple heterojunction wafer, large quantities of ions are implanted into the other parts of the wafer than a portion corresponding to the stripe region to oscillate from the upper surface of the wafer having had the active layer grown, thereby increasing the optical absorption coefficient of the parts of the active layer. Since the absorption coefficient corresponds to the imaginary part of the refractive index, it can be generally said that the stabillization of the optical guiding of the stripe-geometry laser is realized by introducing the complex refractive index difference fixed to the crystal. While this invention is realizable in combination with either the optical guiding stabilization based on the refractive index difference or that based on the absorption coefficient difference, the embodiments is described as to the case where the optical guiding is stabilized by establishing the refractive index difference owing to the impurity diffusion.

On the other hand, regarding dynamic characteristics, in the conventional semiconductor lasers, the carrier distribution is formed with a hole by the rise of the relaxation oscillation peak of the first fundamental mode, so that the optical focusing property is intensified. A mode deformation is caused by the intensified optical focusing, with the result that relaxation oscillations are promoted by a change in the mode gain. In contrast, when the carrier injection region is disposed contiguously to the stripe-shaped active region in the manner to extend on both the sides thereof, this carrier injection region is wider than the laser oscillation portion, and the refractive index space which effects the optical guiding exists within the uniform gain profile. Accordingly, if sufficient carriers are also existent in the outer parts of the laser oscillation region, the hole of the carrier profile caused by the relaxation oscillations is effectively filled up by the diffusion of carriers. Therefore, the relaxation oscillations are suppressed, and the occurrence of the optical focusing and the promotion of the relaxation oscillations due to the mode deformation can be prevented. When the carrier injection region is brought into a width which is not greater than such an extent of value that the carrier diffusion length is added to each side end of the laser oscillation portion, the carriers diffuse after having been injected into the active layer, so that the threshold current value is not considerably increased and that the laser oscillation outside the impurity-diffused region effecting the optical guiding can be prevented.

The effective refractive index is principally determined by the impurity concentrations and the decrease of the refractive index based on a plasma effect induced by the carrier injection. In the case of this structure, the plasma effect by the carrier injection develops over the whole carrier injection region, and hence, the refractive index profile is predominantly formed by the impurity concentration difference between the stripe-shaped active region and the outer regions thereof. Thus, any desired index profile can be formed by the combination of the impurity concentrations, and a stable oscillation of a single transverse mode can be achieved even at a comparatively great stripe width.

As the refractive index difference, a value of at least $|10^{-4}|$ suffices. In the case where the refractive index difference is less than $|10^{-4}|$, the optical guiding is chiefly executed by the gain. Therefore, the gain distribution changes with the change of the carrier distribution, the laser operation becomes unstable, and no stable optical guiding is attained.

The laser device having the sectional structure of FIG. 1 as thus far described brings forth the following beneficial results. A stable oscillation of lower-order transverse modes is executed owing to the optical guiding based on the effective complex refractive index difference. The carrier injection region widened relative to the laser oscillation portion functions to suppress the relaxation oscillations in cooperation with the optical guiding which is less liable to cause mode deformation. Further, in fabricating the laser device with such a structure, since the wider current injection region lies near to the active layer, the portion of an ohmic contact becomes large in area, so that the contact resistance can be made low and that the series resistance can also be made low. This is very advantageous for the characteristics of the laser device.

The structure above described carries out the fundamental transverse mode oscillation in the vicinity of the threshold current value. However, it has the disadvantage that when the operating current is increased with the intention of obtaining a higher output, the carrier density profile decreases in the stripe active region on account of an intense induced emission of the laser beam, whereas the gain of the carrier injection region disposed on both sides of the stripe increases, so the first-order and higher-order transverse mode oscillations are prone to occur.

The mode change liable to occur brings about such drawbacks as the distortion of a response waveform and the increase of noise in case of performing the direct modulation.

In this regard, means for preventing the higher-order modes from easily occurring even when the operating current is increased will be described with reference to FIGS. 2A~2C. As is apparent from FIGS. 2A and 2C, the Zn-diffused regions 14 and 17 are not exposed to the end surfaces of the semiconductor laser device. More specifically, the central cross-sectional view of this laser device does not differ from the sectional structure shown in FIG. 1 at all, but the end parts of the Zn-diffused regions 14 and 17 in the lengthwise direction thereof fall short of both the cleavage surfaces 21 and 22 of the laser device, and non-exciting regions are formed between the Zn-diffused regions and the cleavage surfaces 21 and 22. In order to form the non-exciting regions, when e.g. the Zn-diffused region 14 is to be formed, a mask which has an opening of a width of 5 μm and a length of 250 μm in substantially the central part thereof may be used for a laser device which is 350 μm long.

When the non-exciting region which is disposed in the resonator direction of the active layer (on the light emitting side) and through which the light propagates is held in the state in which the band gap is not contracted, photons generated in the stripe-shaped active region whose effective band gap is contracted have low energy and propagate without being absorbed considerably in the non-exciting region. In contrast, photons generated in the carrier injection region existent outside the strip have only the effect of the decrease of energy attributed to the band gap contraction caused by electronic interactions and are greatly absorbed in the non-exciting region.

Accordingly, the light generated in the stripe-shaped active region 121 passes through the active layer of the non-exciting region between the cleavage surface 21 or 22 and the Zn-diffused region 14 or 17, and it forms stationary waves between reflective surfaces, so that a laser oscillation state is established. On the other hand, most of the light generated in the carrier injection region 122 except the stripe-shaped active region 121 is absorbed in the non-exciting region and is incapable of laser oscillation.

The inventors' experiment has revealed that in the case of a non-exciting region made of a highly doped n-type active layer, the absorption loss which the photons generated in a stripe-shaped active region formed by the impurity compensation suffer in the non-exciting region is $20^{-1}$ cm-$30^{-1}$ cm, whereas the absorption loss which the photons generated in a carrier injection region (highly doped n-type active layer and region to be excited) outside the stripe-shaped active region suffer in the non-exciting region is as large as $200^{-1}$ cm-$300^{-1}$ cm. Accordingly, when the non-exciting region through which the light propagates exists in the vicinity of reflective surfaces under the condition under which the band gap is not contracted, the stripe-shaped active region having the optical guiding can effect oscillation with low loss. In contrast, the carrier injection region contiguous to the stripe-shaped active region has the very large loss in the resonator direction, so that it does not effect oscillation. Since, however, the carriers injected into the carrier injection region diffuse also into the stripe-shaped active region, a laser device which is capable of stable fundamental transverse mode oscillation over a wide range of operating currents can be realized.

In a GaAs semicondctor crystal, there is the effect called Burstein shift in which the band gap expands effectively when the crystal is put into an n-type crystal at high concentration. Accordingly, in the case where the stripe-shaped active region formed by the impurity compensation as above stated is combined with the highly doped n-type non-exciting region, the absorption loss is the least, and the oscillation can be achieved with low loss. Besides, the absorption loss is reduced by the combination between a low concentration n-type stripe-shaped active region and the high concentration n-type non-exciting region or the combination between a high concentration p-type stripe-shaped active region and a low concentration p-type non-exciting region. Also in the case where a p-type stripe-shaped active region which has an impurity concentration within a range bringing forth the band contracting effect is formed in a low concentration p-type active layer which has a carrier injection region and where it is combined with the n-type non-exciting region, the absorption loss of photons generated in the stripe-shaped active region becomes lower in the non-exciting region than that for the photons generated in the carrier injection region outside the stripe-shaped active region, and mode control is possible.

Figures 2A, 2B:
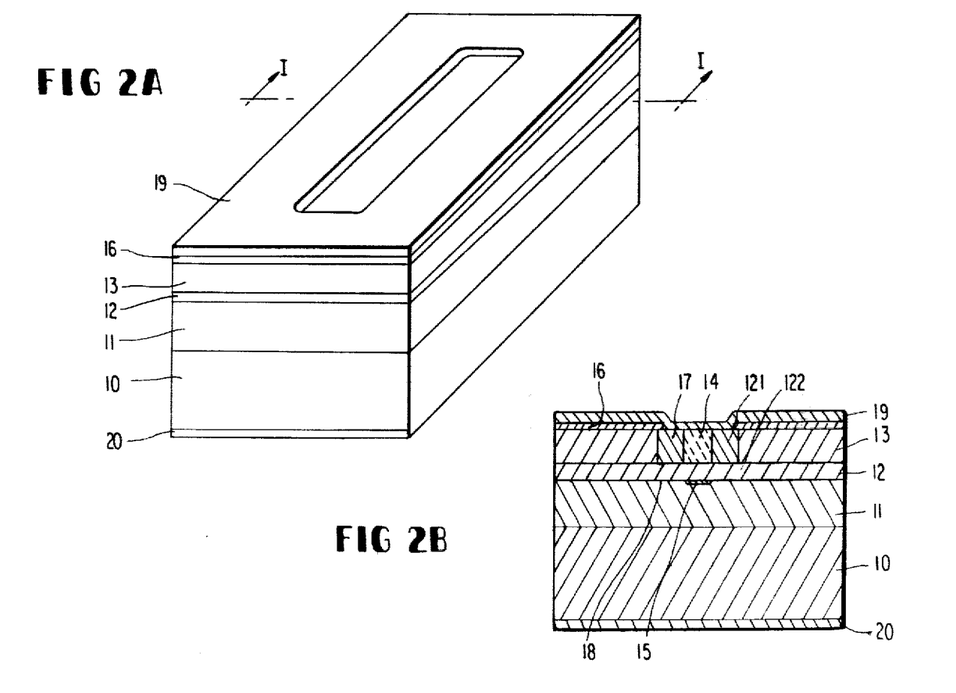
FIG. 2A is a perspective view showing a second embodiment of this invention.
FIG. 2B is a sectional view taken along line I—I in FIG. 2A.
Figures 2C, 3, 4:
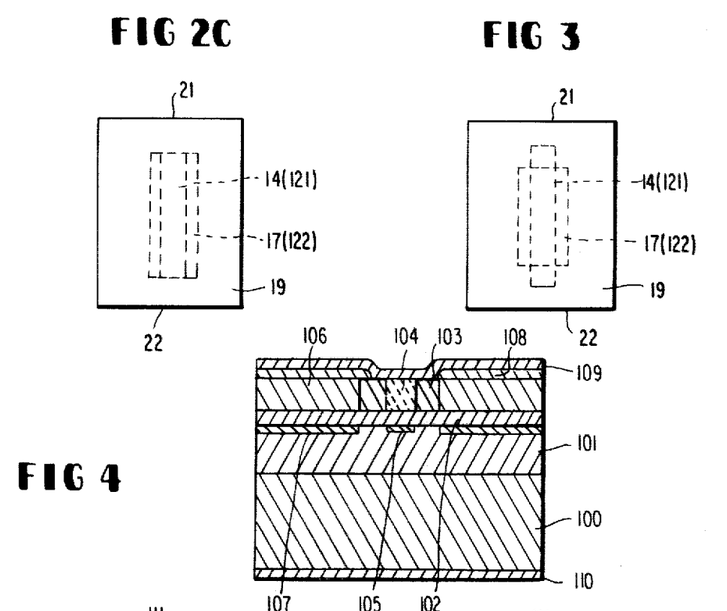

The measure wherein, as in the structure of FIGS. 2A~2C, the active layer lying in contact with the reflective surfaces is made the non-exciting region through which no current flows is greatly effective, not only in that the higher-order mode oscillations are suppressed by exploiting the difference of the absorption losses of the photons as described above, but also in that both of the reflective surfaces are protected. At this time, it is necessary that almost no injection carrier exists in the non-exciting region. To this end, the interval between the non-exciting region and the reflective surfaces needs to be made at least the carrier diffusion length.

As to the dynamic characteristics, in the case of the conventional semiconductor lasers, the carrier distribution is formed with a hole by the rise of the relaxation oscillation peak of the first fundamental mode, so that the optical focusing property within the active layer is intensified. A change in the mode gain is caused by the optical focusing, and relaxation oscillations are promoted. In contrast, when as in the structure of this invention the carrier injection region is made wider than the laser oscillation region so as to cause sufficient carriers to exist outside the laser oscillation region, the carriers diffuse and the hole of the carrier profile caused by the relaxation oscillations is therefore filled up effectively. For this reason, the relaxation oscillations are suppressed, and the promotion of the relaxation oscillations due to a mode deformation based on the occurrence of the optical focusing can be prevented.

In the second embodiment, unlike that in the first embodiment, the carrier injection region contiguous to both the sides of the stripe-shaped active region can be made any desired width.

The stripe-geometry double heterojunction laser device having the structure of the second embodiment has the following beneficial results. A stable optical guiding can be achieved by the refractive index profile formed within the carrier injection region of the active layer, and a stable single transverse mode oscillation is attained over a wide range of operating currents because the non-exciting region whose band gap is not contracted is possessed in the direction of the resonator length.

The measure wherein the active layer contacting with the reflection surface is made the non-exciting region, is effective for the protection of the reflection surface as stated below.

As compared with the conventional double heterojunction laser in which the excitation region is directly exposed to the reflective surfaces, the laser of the embodiment is less prone to chemical reactions with the open air, so that the degradation of the reflection surface due to the chemical reactions can be prevented. In the conventional laser, the vicinity of the surface of the active layer exposed to the reflective surfaces turns into a depletion layer on account of the presence of the surface states, etc. Accordingly, it becomes regions which absorb the laser light. Therefore, when a laser oscillation of high power is conducted, heat develops due to the absorption of the laser light, and optical damage is promoted.

In contrast, when the portions of the active layer contacting with the reflective surfaces are made the non-exciting regions which absorb a little of the laser light, catastrophic optical damage on the reflective surfaces due to the photo-enhanced oxidation is much reduced, and a high power oscillation is possible even at a small stripe width. Another advantage is that, since the excitation region is not directly exposed to both the reflective surfaces, the reflective surfaces can be worked without deteriorating the characteristics of the laser oscillation. Further, by making the carrier injection region wider than the laser oscillation region, a laser device of excellent dynamic characteristics with relaxation oscillations suppressed is obtained. Since, in this structure, the wide carrier injection region lies near to the active layer, the area of an ohmic contact can be made large. Accordingly, the effective contact resistance becomes low and also the series resistance becomes low, which is very advantageous for the characteristics of the laser device.

Laser devices of this structure (FIGS. 2A~2C) have been manufactured and tested. As a result of the tests, it was found that even when the length of the non-exciting region was varied from several times the carrier diffusion length (about 2~3 μm in case of the n-type) to about 300 μm, the rise of the threshold current was small, and the laser devices easily oscillated continuously at room temperature. However, if the length of the non-exciting region is made too small, the absorption loss of light generated in the carrier injection region 122 except the stripe-shaped active region 121 will lessen, and higher-order mode oscillations may start. A preferable range for the length of the non-existing region is 30~60 μm, and a more preferable value is approximately 50 μm.

When the laser beam generated in the stripe-shaped active region 121 passes through the non-exciting region, the wave front spreads. To the end of diminishing such a spread, there is provided a structure wherein the Zn diffusion to form the stripe-shaped active region 121 is made long in the resonator direction, while the carrier injection region 122 is caused to absorb the generated light by making the length of the non-exciting region sufficient. A semiconductor laser device of this structure according to a third embodiment is shown in plan view in FIG. 3.

The structures (FIGS. 2A~2C, FIG. 3) can also be manufactured by fully inverting the p-type and n-type. This is, a p-type $Al_{0.3}Ga_{0.7}As$ layer, a p-type GaAs active layer and a p-type $Al_{0.3}Ga_{0.7}As$ layer are formed on a p-type GaAs substrate by the liquid-phase epitaxial growth, and an n-type impurity is diffused into diffused regions 14 and 17. As the n-type diffusants, there are sulfur (S) etc. Also in this case, light generated in a stripe-shaped active region 121 subjected to the impurity compensation passes through a non-exciting region, whereas light generated in a carrier injection region outside the stripe is much absorbed, so that the characteristics are not inferior.

A fourth embodiment is shown in FIG. 4. An n-type $Al_{0.3}Ga_{0.7}As$ layer 101 which is about 3 μm thick, an n-type GaAs active layer 102 (carrier concentration $\simeq 3 \times 10^{18}$ cm$^{-3}$, Te-doped) which is about 0.2 μm thick, and a p-type $Al_{0.3}Ga_{0.7}As$ layer 103 (carrier concentration $\simeq 1 \times 10^{19}$ cm$^{-3}$, Zn-doped) which is about 2 μm thick are formed on an n-type GaAs substrate 100 by the liquid-phase epitaxial growth.

After forming a $SiO_2$ film on the p-type $Al_{0.3}Ga_{0.7}As$ layer 103, Zn is diffused through an opening having a width of 5 μm and a length of 250 μm to form a Zn-diffused region 104 having a diffusion front 105 as in the structure of the second embodiment.

Figure 5:
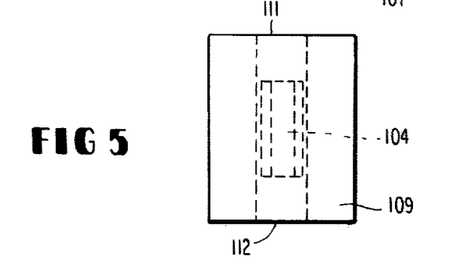
FIG. 5 is a plan view of the embodiment in FIG. 4.

After removing the $SiO_2$ film, a new $SiO_2$ film is formed on the $Al_{0.3}Ga_{0.7}As$ layer 103. Using the photoresist technique, the $SiO_2$ film is etched to be left in the form of a belt having a width of 18 μm around the Zn-diffused stripe, the other parts of the $SiO_2$ film being removed. Sulfur (S) is diffused into the resultant substrate at high concentration, and those parts of the p-type $Al_{0.3}Ga_{0.7}As$ layer 103 which are not covered with the $SiO_2$ film are turned into n-type S-diffused region 106. The diffusion is controlled so that the diffusion front 107 may lie within the first layer of the n-type $Al_{0.3}Ga_{0.7}As$. Subsequently, the $SiO_2$ film is removed, $SiO_2$ film is formed on the $Al_{0.3}Ga_{0.7}As$ layer 103 anew, and a stripe-shaped opening having a width of 13 μm and a length of 250 μm is provided in the central part of the $SiO_2$ film by the use of the photoresist technique. Thus, the region 106 in which the $Al_{0.3}Ga_{0.7}As$ 103 is turned into the n-type can be fully covered with the $SiO_2$ film 108. Thereafter, an ohmic contact 109 and an n-type ohmic contact 110 are formed. Then, a semiconductor laser device is obtained (FIG. 4). FIG. 5 is a plan view of the fourth embodiment (FIG. 4).

Figure 6:
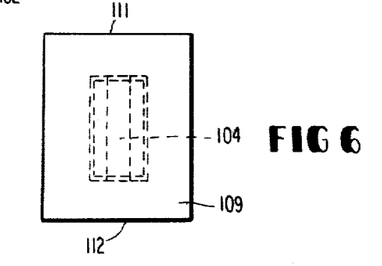
FIG. 6 is a plan view of a semiconductor laser device which is a fifth embodiment of this invention and in which in the structure of FIG. 4, the impurity is also diffused in the vicinity of a reflective surface so as to prevent a p-n junction from being exposed to the reflective surface.

Referring to FIG. 5, a p-n junction which is defined by the p-type $Al_{0.3}Ga_{0.7}As$ layer 103 and the n-type GaAs layer 102 is exposed to cleavage surfaces 111 and 112. When an intense electric field is applied to the p-n junction, chemical reactions with the open air are promoted which result in the degradation of reflective surfaces. In the case where the exposure of the p-n junction needs to be prevented, the opening of the $SiO_2$ film is formed in the dimensions of a width of 18 μm and a length of 250 μm, and S is diffused to turn also the parts of the p-type $Al_{0.3}Ga_{0.7}As$ layer 103 near the cleavage surfaces into the n-type. A plan view of this structure as a fifth embodiment is shown in FIG. 6. The n-type concentration of the active layer 103 at this time becomes high, and the effect of Burstein shift in which the band gap is effectively expanded is produced, so that the structure is effective as in the other cases or more in regard to the absorption of light.

It is to be understood that also the fourth embodiment can be constructed by fully inverting the p-type and n-type.

Figures 7, 8, 9:
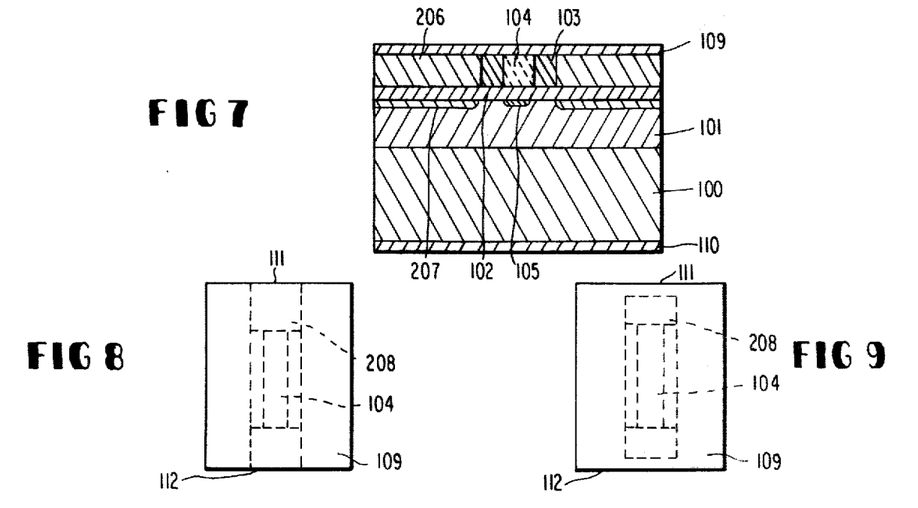
FIG. 7 is a sectional view of a semiconductor laser device which is a sixth embodiment of this invention and in which in the embodiment of FIG. 4, a carrier injection region is formed by proton bombardment of outer parts thereof.
FIG. 8 is a plan view of a seventh embodiment of this invention.
FIG. 9 is a plan view of a semiconductor laser device which is an eighth embodiment of this invention and in which in the structure of FIG. 7, the proton bombardment is also carried out in the vicinity of a reflection surface so as to prevent a p-n junction from being exposed to the reflective surface.

As a sixth embodiment, instead of the n-type S diffusion in the fifth embodiment, proton bombardment may be carried out by the use of a stripe mask as illustrated in FIG. 7. Then, a similar structure can be fabricated. In this case, the electrode 109 can be formed directly on a proton-bombarded region 206. The depth of the front end 207 of the bombarding proton need not penetrate through the active layer 102.

A seventh embodiment wherein a $SiO_2$ insulating film 208 is formed in the vicinities of the reflective surfaces in the construction of the sixth embodiment so as to dispose non-exciting regions is shown as in plan view in FIG. 8. Also in this case, the p-n junction is exposed to the cleavage surfaces 111 and 112, and hence, in order to prevent the exposure, the proton bombardment or S-diffusion at low concentration may be done in the vicinities of the cleavage surfaces. This is illustrated in FIG. 9 as an eighth embodiment.

If the proton bombardment is at high concentration, annealing is carried out after the bombardment. Thus, while holding a high electrical resistance, the optical absorption can be recovered up to its characteristics before the bombardment. Therefore, no drawback takes place. It is also possible to apply bombardments with other inert ions than protons.

Figure 10:
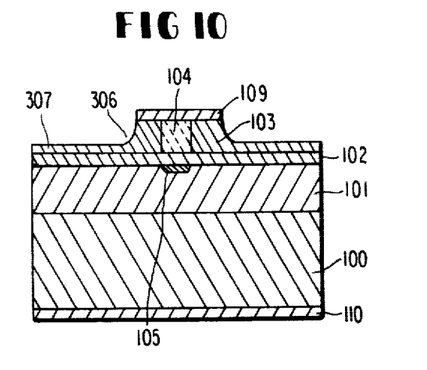
Figure 11:
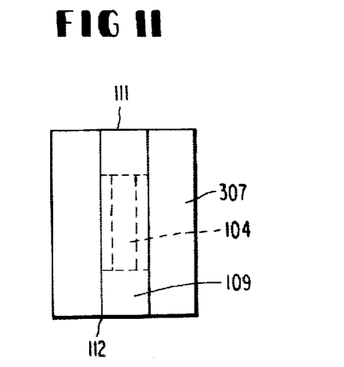
FIG. 11 is a plan view of the embodiment in FIG. 10.

A ninth embodiment is shown in FIGS. 10 and 11. Instead of the n-type S diffusion in the structure of the fourth embodiment, the layer 103 is left in the shape of a stripe and the other part is etched off (306), and a $SiO_2$ insulating film 308 is deposited in the vicinities of the reflective surfaces to form non-exciting regions. At this time, the front part 307 of the mesa etching is controlled so as to lie near the interface between the third layer and the active layer.

As the method of establishing the refractive index difference, the case of introducing the electrically active impurities have been described in the various embodiments. The effective refractive index difference can also be established in such a way that crystal lattices are ruined by introducing an electrically inert substance by means of, for example, proton bombardment.

Besides, there is a method wherein a stripe-shaped active region is made of GaAs, the entire region is buried in a mixed crystal such as AlGaAs so as to establish the refractive index difference, and a wider carrier injection region is provided in the mixed crystal.

In the various embodiments above described, thin films of $Al_2O_3$, $SiO_2$, C etc. may be deposited onto the reflective surfaces to form stable surface protective films for crystal and air interfaces. This is more effective for preventing the degradation of the reflection surfaces due to photo-enhanced mirror oxidation.

Needless to say, the diffusant, the stripe width, the stripe length and the length of the non-exciting region are not restricted to those mentioned previously.

In the foregoing embodiments, the case of forming three layers on a substrate has been referred to. As will be stated below, however, this invention is also applicable to a case of forming four layers on a substrate.

Figure 12:
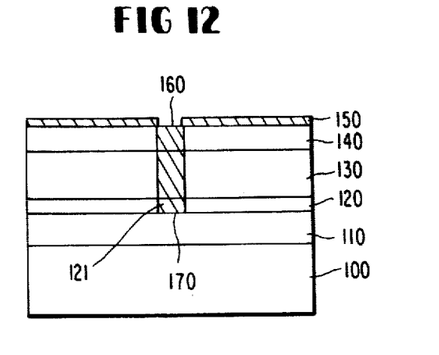
FIGS. 12, 13 and 14 are sectional views illustrative of steps based on the diffusion of Zn.
Figure 13:
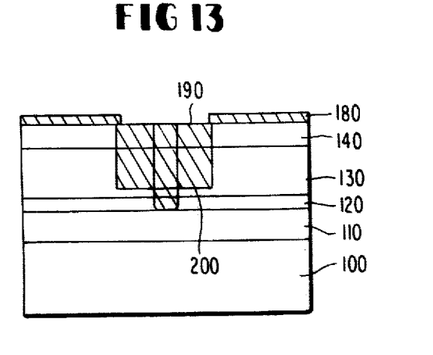
Figure 14:
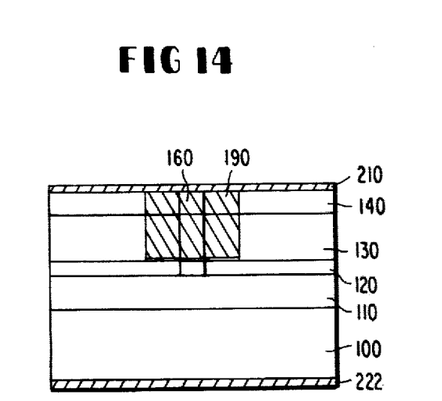

A tenth embodiment of this invention is shown in FIG. 12. An n-type $Al_{0.3}Ga_{0.7}As$ layer 110 being about 3 μm thick, an n-type GaAs active layer 120 being about 0.2 μm thick (carrier concentration $\simeq 3 \times 10^{18}$ cm$^{-3}$, Te-doped), a p-type $Al_{0.3}Ga_{0.7}As$ layer 130 being about 2 μm thick, and an n-type GaAs layer 140 being about 1 μm thick are grown on an n-type GaAs substrate 100 by the liquid-phase epitaxial growth. In a $SiO_2$ film 150 deposited on the fourth layer 140, a stripe 5 μm wide is provided in the direction perpendicular to cleavage surfaces by the photoresist technique. Through the stripe, Zn is diffused at low concentration to form Zn-diffused region 160. The diffusion front 170 of this diffusion is controlled so as to lie in contact with the interface between the active layer 120 and the n-type $Al_{0.3}Ga_{0.7}As$ layer 110 or to be somewhat deeper. At this time, A Zn-diffused region 121 within the active layer 120 is turned into a p-type region having a carrier concentration of $3-8 \times 10^{18}$ cm$^{-3}$ and subjected to the so-called impurity compensation. Thus, a refractive index difference is established between the Zn-diffused region 121 and the other portion of the active layer 120. Subsequently, the $SiO_2$ film 150 is removed, and as shown in FIG. 13, a stripe which has a width of 20 μm around the Zn-diffused stripe is provided by the the photo-resist technique in a $SiO_2$ film 180 deposited on the fourth layer 140 anew. Zn is diffused through the stripe opening (Zn-diffused region 190). The diffusion front 200 of this diffusion is controlled so as to lie in the p-type. $A_{0.3}Ga_{0.7}As$ layer 130 just before the active layer 120. For Zn-diffusion at this time, the closed tube process is used employing a metal Zn source at 700° C., and the concentration of the diffusion is made $2-3 \times 10^{19}$ cm$^{-3} - 10^{20}$ cm$^{-3}$. Thereafter, the $SiO_2$ film 180 is removed, and a p-type ohmic contact 210 and an n-type ohmic contact 220 are formed as shown in FIG. 14. Then, a semiconductor laser device is finished. Accordingly, the profile of carriers to be injected into the active layer becomes nearly flat. The device thus obtained is low in both contact resistance and series resistance. Further, the surface electrodes can be formed flat, which is advantageous in packaging. It goes without saying that, also in the structure of FIG. 14, the non-exciting region as in FIGS. 2A~2C or FIG. 3 can be formed.

Figure 15:
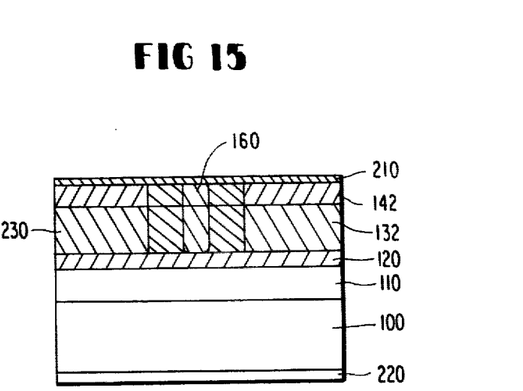
FIG. 15 is a sectional view in the case of performing proton bombardment.

FIG. 15 shows an eleventh embodiment. This is a semiconductor laser device wherein, after forming a p-type $Al_{0.3}Ga_{0.7}As$ layer 132 into a high concentration p-type layer (carrier concentration $\simeq 10^{19}$ cm$^{-3}$) and a fourth layer 142 into a high concentration p-type GaAs layer (carrier concentration $\simeq 10^{19}$ cm$^{-3}$) by the liquid-phase equtaxial growth, Zn is diffused at low concentration as in FIG. 12, whereupon the portion of the resultant substrate outside a width of 20 μm is bombarded with protons down to the active layer 120 (proton bombardment region 230) into a semi-insulating region. Also in this case, a device in which an effective refractive index difference is established in a uniform carrier profile can be obtained similarly to the case of FIG. 14.

Figure 16:
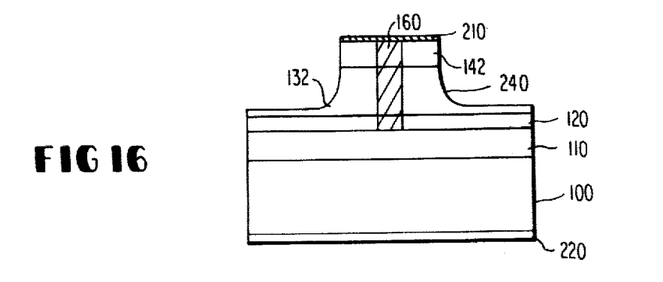
FIG. 16 is a sectional view in the case of performing mesa-etching.

FIG. 16 shows a twelfth embodiment. After diffusing Zn at low concentration as in FIG. 15, mesa etching at 240 is carried out instead of the bombardment with protons, whereby the flow of current is regulated. The mesa etching is controlled so as to terminate just before the active layer 120.

Figure 17:
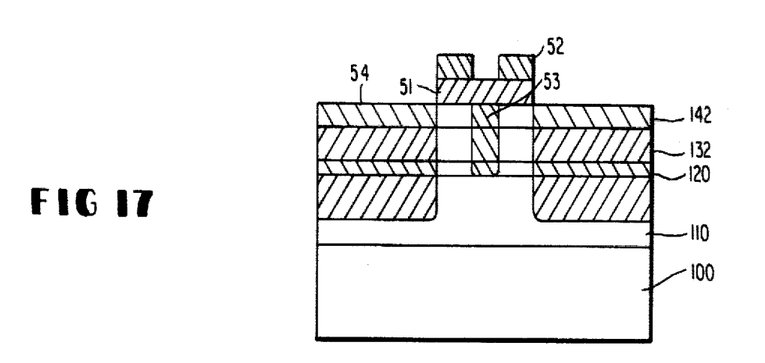
FIGS. 17, 18 and 19 are sectional views illustrative of proton bombardment steps of easy allignment.
Figure 18:
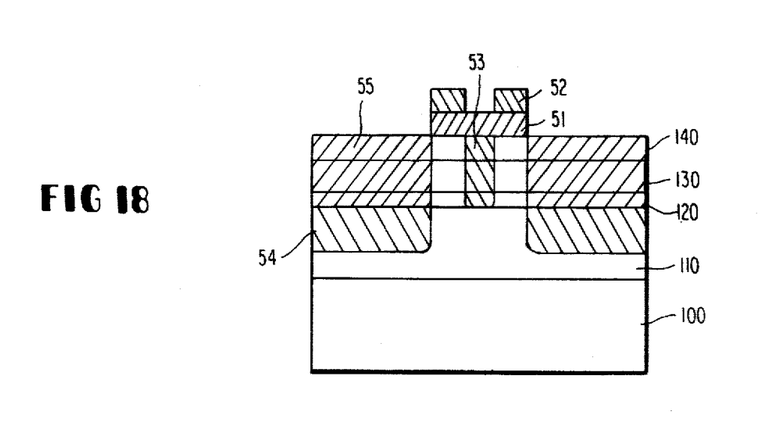
Figure 19:
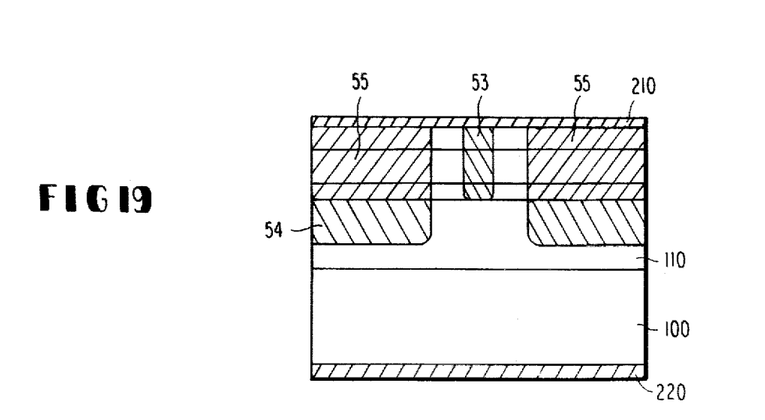

FIGS. 17 to 19 illustrate an embodiment according to which, in the case of producing the structure of this invention by the proton bombardment technique, the alignment between a stripe active region and a carrier injection region is facilitated. First of all, as shown in FIG. 17, an n-type $Al_{0.3}Ga_{0.7}As$ layer 110 being approximately 3 μm thick, an n-type GaAs active layer 120 being approximately 0.2 μm thick (carrier concentration $\simeq 3 \times 10^{18}$ cm$^{-3}$, Te-doped), a p-type $Al_{0.3}Ga_{0.7}As$ layer 132 being approximately 1 μm thick (carrier concentration = $1 \times 10^{19}$ cm$^{-3}$, Zn-doped) and a p-type GaAs layer 142 being approximately 0.8 μm thick (carrier concentration $\simeq 1 \times 10^{19}$ cm$^{-3}$, Zn-doped) are grown on an n-type GaAs substrate 100 by the liquid-phase epitaxial growth. Using the photoresist technique, a shield mask 51 which is 20 μm wide is formed on the fourth layer 142 in a manner to extend in a direction perpendicular to cleavage surfaces. Thereafter, using the photoresist technique again, shield masks 52 each having a width of 6 μm are formed on both ends of the mask 51 except a central part of 5 μm thereof. In the case of employing, e.g., AZ111 (photo-resist of Shipley Co. of Newton, Mass.) for the shield masks, the thickness of the shield mask 51 may be made 3 μm and that of the shield mask 52 at least 3 μm as apparent from the specification of Japanese Patent Application No. 33366/1975 filed by the applicant of the present application. Subsequently, while heating the substrate under this state, it is bombarded with protons in an amount of approximately $10^{17}$ cm$^{-2}$. The acceleration energy is selected so that the protons may penetrate the shield mask 51 to reach the active layer 120 through the p-type GaAs layer 142 and the p-type $Al_{0.3}Ga_{0.7}As$ layer 132 (proton bombardment region 53). At this time, the protons cannot penetrate the parts in which the shield masks 51 and 52 are placed one over the other. On the other hand, outside the shield masks, a proton bombardment region 54 is formed down to an intermediate position of the n-type $Al_{0.3}Ga_{0.7}As$ layer 110. At the next step, as illustrated in FIG. 18, the resultant substrate is bombarded with protons approximately $10^{18}$ cm$^{-2}$ at room temperature. The acceleration energy is selected so that the protons may be isolated by the shield mask 51, but still may get at the active layer 120 outside the mask to form a proton bombardment region 55. After the bombardment, the proton shield masks 51 and 52 are removed as shown in FIG. 19, and the substrate is annelaed at 550° C. for 15 minutes so as to remedy damages having occurred in the proton bombardment region 53. Meanwhile, the proton bombardment region 55 falls into an electrically insulating state owing to the annealing. Subsequently, a p-type ohmic electrode 210 and an n-type ohmic electrode 220 are respectively formed on the upper and lower surfaces. Thus, a semiconductor laser of this invention is produced.

Summarizing the measure illustrated in FIGS. 17-19, the ion shield mask of the structure in which the central part is thinner than the surrounding parts is formed into the stripe shape on the wafer of the double heterojunction semiconductor laser which has the highly doped clad layer on the active layer; thereafter, while heating the wafer, it is bombarded with ions at the energy at which they penetrate through the central part of the stripe-shaped mask to reach the active layer, whereby the impurity of the clad layer is accelerated and diffused into the active layer; subsequently, the wafer is bombarded with ions at high concentration at the energy at which they do not penetrate through the mask portion; and thereafter, the heat treatment is carried out at a temperature above that of the heating of the wafer, whereby the absorption coefficient of the portion of the wafer under the central part of the mask deteriorated by the heated ion bombardment is recovered. On the other hand, the regions of the wafer outside the mask are endowed with the electric semi-insulating property owing the second bombardment at high concentration, whereby uniform current regions are simultaneously formed.

More specifically, the wafer is bombarded with the ions by heating the wafer from above the highly doped clad layer, and defects develop in the ion-bombarded portion. Since the impurity in the clad layer diffuses through the defects caused by the ion bombardment, an accelerated diffusion phenomenon oocurs in the ion-bombarded portion. Moreover, since the central part of the mask is thin, it is possible to induce the accelerated diffusion under the central part only and to prevent the ion bombardment under both the side parts of the shield mask. Although the accelerated diffusion takes place also in the regions outside the stripe-shaped shield mask, the parts become the semi-insulating regions by performing the proton bombardment of high concentration later, and hence, they have no influence on the characteristics of the laser.

The accelerated diffusion phenomenon is determined by the quantity of proton bombardment and the bombardment energy. Since the quantity of proton bombardment and the bombardment energy can be easily controlled with high precision, the quantity and depth of the impurity to be diffused by the heat treatment can be accurately controlled. Moreover, the defects having developed in the portion under the central part of the mask in which the accelerated diffusion has been executed are extinguished by the last heat treatment, and they do not affect the laser characteristics at all. Since the high concentration ion bombardment has been carried out in the portions which do not correspond to the shield mask, the portions can be endowed with the electrically semi-insulating property even by the last heat treatment. Accordingly, the carrier injection region is restricted to only the portion corresponding to the stripe-shaped mask, and an appropriate refractive index difference is formed within the active layer under the central part of the mask by virtue of the accelerated diffusion.

By exploiting the method of FIGS. 17 to 19 as above described, merely by forming the single shield mask, the laser of the structure which has a uniform carrier profile in the active layer and which has a refractive index difference in the central part of the active layer can be manufactured on a mass-production basis. In addition, inexact alignments as in the cases illustrated in FIGS. 1 to 16 can be fully eliminated.

The various embodiments above described are applicable to other materials than the GaAs-AlGaAs double heterojunction wafer, such as InGaAsP-InP and GaAsSb. The diffusant impurity is not restricted to Zn, but similar beneficial results are obtained even with other elements, such as cadmium (Cd), magnesium (Mg) or silicon (Si).

What is claimed is:

1. A stripe-geometry heterostructure semiconductor laser comprising:
   first and second ohmic contacts,
   a multilayer active medium including a first epitaxial layer of $Al_xGa_{1-x}As$, a second epitaxial layer of $Al_yGa_{1-y}As$, $0 \leq y \leq x$, thereby forming a first heterojunction at the interface therebetween, and a third epitaxial layer of $Al_zGa_{1-z}As$, $z > y$, thereby forming a second heterojunction at the interface between said $Al_zGa_{1-z}As$ layer and said $Al_yGa_{1-y}As$ layer, said medium having a pair of spaced parallel reflective surfaces forming a pair of mirrors of an optical resonator, said second layer including a first region extending between said reflective surfaces in a stripe-like manner with the ends thereof spaced apart from said reflective surfaces, and a second region contiguous to said first region and extending between said reflective surfaces and having a predetermined band gap, said first region having a band gap narrower than that of said second region, said third layer including a third region extending between said reflective surfaces so as to overlay said first region, the width of said third region being wider than that of said second region, said third region being adapted to inject carriers into said second layer.

2. A laser device as claimed in claim 1, wherein the ends of said third region are spaced apart from said reflective surfaces.

3. A double heterostructure injection laser comprising: first and second ohmic contacts, an n-type GaAs substrate, a first layer made of n-type $Al_xGa_{1-x}As$ epitaxially grown on one major surface of said substrate, a second layer made of n-type $Al_yGa_{1-y}As$ epitaxially grown on said first layer, $0 \leq y \leq x$, a third layer made of n-type $Al_zGa_{1-z}As$ epitaxially grown on said second layer, $z > y$, said second and third layers having a strip-shaped p-type region extended from the surface of said third layer to a portion of said second layer by means of the selective diffusion of p-type impurities, said stripe-shaped p-type region and a contiguous region extending between a pair of spaced parallel reflective surfaces of said laser and lying within said second layer having different impurity characteristics such that said p-type region has an effective refractive index difference with respect to said contiguous region at least $|10^{-4}|$, a silicon dioxide film formed on said third layer and having a stripe-shaped opening having a width wider than that of said stripe-shaped p-type region, said third layer further having a p-type region formed by means of the selective diffusion of p-type impurities through said stripe-shaped opening and thereby partly overlapping said stripe-shaped p-type region, said p-type region and said stripe-shaped p-type region being spaced apart from the reflective surfaces of said second and third layers.

4. A stripe-geometry heterostructure semiconductor laser comprising:

first and second ohmic contacts, a multilayer active medium including a first semiconductor layer, a second semiconductor layer having wider energy band gap than that of said first layer, thereby forming a first heterojunction at the interface therebetween, and a third semiconductor layer having wider energy band gap than that of said first layer, thereby forming a second heterojunction at the interface between said third layer and said second layer, said medium having a pair of spaced parallel reflective surfaces forming a pair of mirrors of an optical resonator, said second layer including a first region extending between said reflective surface in a stripe-like manner, and a second region substantially surrounding said first region and extending between said reflective surface and having a predetermined uniform band gap, said first region having a band gap narrower than that of said second region, said third layer including a third region extending between said reflective surfaces so as to overlay said first region, the width of said third region being wider than that of said first region, and said third region having a carrier injection region being adapted to inject carriers into said second layer.

5. A laser device as claimed in claim 4, wherein said stripe region and said carrier injection region are separated from said reflective surfaces by non-exciting regions having lengths at least that of the carrier diffusion length.

6. A laser device as claimed in claim 5, wherein the length of the non-exciting regions is in the range of 30~60 μm.

7. A laser device as claimed in claim 5, wherein said stripe region is longer than said carrier injection region.

8. A laser device as claimed in claim 4, wherein the difference in said refractive indices is at least $|10^{-4}|$.

9. A laser device as claimed in claim 4, wherein said first, second and third semiconductor layers are n-type semiconductors and a p-type impurity is diffused into said second and third layers to form said stripe region and said carrier injection region.

10. A laser device as claimed in claim 4, wherein said first, second and third semiconductor layers are p-type semi-conductors and an n-type impurity is diffused into said second and third layer to form said stripe region and said carrier injection region.

11. A laser device as claimed in claim 4, wherein said third semiconductor layer, not including said carrier injection region, is diffused with an impurity at high concentration.

12. A laser device as claimed in claim 4, wherein said third semiconductor layer, not including said carrier injection region, is subjected to proton bombardment.

13. A laser device as claimed in claim 4, wherein said third semiconductor layer, not including said carrier injection region, is etched to form a mesa structure.

14. A laser device as claimed in claim 4, further comprising thin films deposited on said reflective surfaces to prevent photo-enhanced oxidation of said reflective surfaces.

15. A laser device as claimed in claim 4, including a fourth semiconductor layer over said third semiconductor layer, said first, second and fourth semiconductor layers being of one conductivity type, and said third semiconductor layer being of the opposite conductivity type.

16. A laser device as claimed in claim 4, including a fourth semiconductor layer over said third semiconductor layer and wherein said fourth semiconductor layer and said third semiconductor layer, not including said carrier injection region, are subjected to proton bombardment.

17. A laser device as claimed in claim 4, including a fourth semiconductor layer over said third semiconductor layer and wherein said fourth semiconductor layer and said third semiconductor layer, not including said carrier injection region, are etched to form a mesa structure.

18. A laser device as claimed in claims 1 or 4, wherein said first region is formed by diffusing an impurity having a first conductivity type so as to penetrate said second layer from the side of said third layer, and said third region includes a first portion having said first conductivity type and aligned with said first region and a second portion located outside said portion and having said first conductivity type and having a lower impurity concentration than that of said first portion.

* * * * *